United States Patent [19]

Doi

[11] Patent Number: 5,830,310

[45] Date of Patent: Nov. 3, 1998

[54] APPARATUS AND METHOD FOR DETECTING END POINT OF POST TREATMENT

[75] Inventor: Satoshi Doi, Izumi, Japan

[73] Assignee: Anelva Corporation, Japan

[21] Appl. No.: 579,321

[22] Filed: Dec. 27, 1995

[30] Foreign Application Priority Data

Jan. 13, 1995 [JP] Japan .................................. 7-004467

[51] Int. Cl.$^6$ .............................. C23F 1/02; C23C 16/00; C23C 14/00
[52] U.S. Cl. ................. 156/345; 118/723 R; 204/298.32
[58] Field of Search ....................... 156/345; 118/723 R; 204/298.32

[56] References Cited

PUBLICATIONS

G. Bruno, et al. "Study of the NF3 Plasma Cleaning of Reactors for Amorphous Silicon Deposition." May/Jun. 1994, pp. 690–698.

Primary Examiner—Susan A. Loring
Attorney, Agent, or Firm—Edward D. Manzo; Mark J. Murphy

[57] ABSTRACT

For use with CVD apparatus, an apparatus and method for detecting the end point of a post treatment after an in-situ cleaning operation is provided such that reactive chemical species which remain after an in-situ cleaning operation can be accurately removed so that they do not cause harm to a film formed after the cleaning operation. The end point detection apparatus includes a reactor, an RF electrode, an RF power supply, a gas supply pipe for forming a thin film, a gas supply pipe for in-situ cleaning, a detector for detecting discharge characteristic values (i.e. the self-bias voltage, the electrode voltage, and the discharge impedance) during the post treatment performed after the in-situ cleaning, and a monitor/determining circuit for monitoring an output from the detector. When a post treatment is performed in the reactor after in-situ cleaning, a gas for in-situ cleaning is introduced through the gas supply pipe, and the reactor is in-situ cleaned using reactive chemical species, after which the post treatment is performed in the reactor so that the remaining reactive chemical species are removed. During the post treatment, the discharge characteristic values are measured, and the point in time at which the changes in the measured values shift to nearly constant values is assumed to be the end point of the post treatment.

9 Claims, 6 Drawing Sheets

APPARATUS AND METHOD FOR DETECTING END POINT OF POST TREATMENT

BACKGROUND OF THE INVENTION

1. Field of the Invention

The present invention relates to an apparatus and method for detecting the end point in time of a post treatment after an in-situ cleaning operation.

2. Description of the Related Art

During the manufacture of thin film transistors (TFTs) for liquid-crystal displays or semiconductor devices, a plasma enhanced chemical vapor deposition (PECVD) apparatus is used to manufacture thin films of amorphous silicon (a-Si), or silicon-containing compounds, such as silicon nitride, silicon oxide or silicon oxynitride. In the PECVD apparatus, the silicon-containing compound films and silicon-based polymer are deposited on electrodes and on the inner wall of a reactor other than a substrate. The thickness of the deposited silicon-containing compound film increases as the thin films are repeatedly formed. When the thickness of the deposited silicon-containing compound film reaches a certain film thickness, the deposited silicon-containing compound film peels off from the inner wall and the electrodes, and forms fine particulates. If the fine particulates land on a substrate surface, defects occur in the TFTs, resulting in a deterioration in the yield of manufactured electric devices. Therefore, in a conventional PECVD apparatus, a silicon-containing compound deposited on the electrodes and the inner wall must be removed before the silicon-containing compound deposited on the electrodes and the inner wall peels off.

Since, in the PECVD apparatus, thin films are formed under a reduced pressure in a reactor, it is preferable that the silicon-containing compound be removed after a short period of time and without exposing the interior of the reactor to atmospheric air. For this purpose, performing an "in-situ cleaning" operation is most effective. The in-situ cleaning is what is commonly called a plasma self-cleaning technique. In the plasma self-cleaning technique, silicon-containing compounds deposited on the electrodes and the inner wall are removed by using reactive chemical species, such as fluorine radicals, produced by an electric discharge plasma. The plasma self-cleaning technique is widely used in PECVD apparatus for large-scale production requiring a high yield and a high-uptime ratio.

When the interior of the reactor is in-situ cleaned by active chemical species, these species adhere onto the electrodes and the inner wall of the reactor at the same time the silicon-containing compound deposited on the electrodes and the inner wall is removed. The reactive chemical species then remain inside the reactor after the in-situ cleaning process. Problems occur if an attempt is made to manufacture another silicon-containing compound thin film in the reactor while the reactive chemical species remain. For example, one of the following can occur: the silicon-containing compound film is not formed on the substrate at all; the deposition rate of the silicon-containing compound film decreases; the characteristics of the silicon-containing compound film deteriorate considerably; or the silicon-containing compound film characteristics before the cleaning process are not reproduced. Therefore, it is necessary to remove the remaining reactive chemical species from the reactor after the in-situ cleaning process.

Various methods have been considered to remove the remaining reactive chemical species. Particularly effective is a seasoning operation after the in-situ cleaning process is completed but before the formation of the thin film is restarted. In the seasoning operation, a silicon hydride gas or a mixture of silicon hydride gas and another gas, such as for example hydrogen, nitrogen, or ammonia gas, which are used to form the thin film, are introduced into the reactor. A plasma is then generated in the silicon hydrogen gas or the mixture gas in order to remove the remaining reactive chemical species. This is hereinafter referred to as a "post treatment." According to this post treatment, reactive chemical species remaining on the electrodes and the inner wall, for example fluorine radicals, are sealed up in a silicon-based film formed on the electrodes and the inner wall, or they are transformed into a volatile silicon fluoride and evacuated. Reactive chemical species, which remain on the electrodes and the inner wall after the in-situ cleaning process, then react heavily with chemical species produced by a thin film formation gas plasma, such as the mixture gas plasma of silicon hydride and hydrogen. Thus, it is possible to almost completely remove the reactive chemical species by such a post treatment.

There has, however, been no method of directly detecting the end point of the post treatment. Hitherto, the end point has been determined empirically through data stored from the post treatment experiments in individual apparatus.

However, this presents a problem that when the end point is determined empirically, there is no confirmation as to whether the post treatment has been carried out inside the reactor for an appropriate processing time period. An excessive processing time period causes the throughput to decrease and causes the electrodes and the inner wall cleaned in the in-situ cleaning process to be contaminated again at this stage of the post treatment. On the other hand, if there is an insufficient processing time period, reactive chemical species remaining after in-situ cleaning are not completely removed. As a result, the thin film formed after the post treatment does not reproduce the thin film characteristics, such as electrical conductivity, achieved before the in-situ cleaning process.

SUMMARY OF THE INVENTION

The present invention is directed to finding accurately the end point of a post treatment so that reactive chemical species remaining after the in-situ cleaning process can be completely removed. It is an object of the present invention to provide an apparatus and method for detecting the end point of a post treatment after an in-situ cleaning process. Preferably, this is for a PECVD apparatus.

To achieve the above-described object, according to the present invention, in a post treatment after the in-situ cleaning operation is completed using reactive chemical species, the end point of the post treatment is determined based on changes in the self-bias voltage, the RF electrode voltage, and the electric-discharge impedance of the plasma. These are hereinafter referred to as "discharge characteristic values."

Where discharge is generated in a silicon-containing gas in a post treatment, and when the self-bias voltage, the electrode voltage and the discharge impedance, i.e., the discharge characteristic values, are measured at a RF electrode mounted inside the reactor of the PECVD apparatus, the discharge characteristic values change with the passage of the time of the post treatment. These values gradually make a transition from a sharp change during the initial post treatment to a slight change, and become nearly constant after a certain time period. The thin film formed on the substrate, when the discharge characteristic values are varying, does not reproduce the thin film characteristics before the in-situ cleaning operation (and the film deposition rate decreases). In contrast, the thin film formed after the post treatment is terminated and when the discharge characteristic values become constant, reproduces the thin film characteristics achieved before the in-situ cleaning operation and the film formation rate before the in-situ cleaning operation is reproduced in the thin film formation. Accordingly, the inventor of the present invention found that the end point of the post treatment can be accurately detected by measuring changes in the discharge characteristic values at the RF electrode during the post treatment.

When the post treatment is started, dielectric films (i.e. silicon-containing compound) begin to be formed on the surface of the RF electrode. When the dielectric films are being formed on the surface of the electrode, the discharge impedance varies sharply, and at the same time in response to this variance, the self-bias voltage and the electrode voltage also vary. In the period of this sharp change, the reactive chemical species remaining on the electrodes, which the discharge plasma reaches easily, and in the vicinity thereof inside the reactor are easily removed. However, it is difficult for the discharge plasma to reach the inner wall of the reactor, and therefore, a large amount of reactive chemical species still remains on the inner wall.

After this sharp change, the discharge characteristic values change gradually. This gradual change is caused by the gradual removal of the reactive chemical species at the places where it is difficult for the discharge plasma to diffuse, such as the inner wall of the reactor. If the post treatment is terminated during the period of this gradual change, the reactive chemical species remaining on the inner wall are not sufficiently removed. Accordingly, a thin film, formed after the post treatment is terminated during this period of gradual change, is not yet in a state in which the thin film characteristics are completely sound.

After the gradual change of the discharge characteristic values, the values become nearly constant. The period in which the discharge characteristic values are nearly constant indicates that the reactive chemical species residues are completely removed from the reactor. Therefore, during this period, the reactor atmosphere has returned to the plasma atmosphere of film formation process. A thin film formed, after the post treatment is terminated in this period, reproduces the thin film characteristics before the in-situ cleaning process. Hence, in this period, the post treatment has been terminated. The point in time at which the discharge characteristic values become nearly constant is made to be the end point of the post treatment.

According to one aspect of the present invention, there is preferably provided an end point detecting apparatus comprising a detecting circuit for detecting the discharge characteristic value at a RF electrode; and a monitoring/determining circuit comprising means for determining the end point while monitoring an output signal from the detecting circuit during a post treatment after in-situ cleaning.

The detecting circuit preferably includes a resistance divider circuit, a smoothing circuit, and a voltage detector in order to detect a self-bias voltage. Further, the preferred detecting means includes a capacitor dividing circuit, a smoothing circuit, and a voltage detector in order to detect an electrode voltage. Further, the preferred detecting means includes an electric current probe, a voltage probe, a digitizer, and an impedance computation device in order to detect a discharge impedance.

Preferably, the monitor/determining circuit monitors the value obtained by differentially analyzing the output signal of the detecting circuit, and when the point in time at which the differentially obtained value reaches zero is found, indicates that the point in time is an end point. The monitor/determining circuit can also find the point in time at which the output signal of the detecting circuit shifts to a constant value and indicates that the point in time is an end point.

Most preferably, the end point detecting apparatus is incorporated in a PECVD apparatus comprising a reactor capable of reducing pressure, RF electrodes disposed inside the reactor, a power supply for applying RF electric power to the RF electrodes, a first gas supply for introducing gas for forming a thin film into the reactor, and a second gas supply for introducing gas for in-situ cleaning the interior of the reactor.

Another aspect of the present invention is a method of detecting the end point of a post treatment which is performed after an in-situ cleaning process and before a thin film formation process. In the post treatment, gas comprising elements which react chemically with reactive chemical species remaining in the reactor during in-situ cleaning are introduced into the reactor, and a plasma is generated in the gas in order to remove the remaining reactive chemical species. During the post treatment, the discharge characteristic value of the plasma is detected, and a detected output signal is monitored. The point in time at which the detected output signal becomes a constant is assumed to be an endpoint. At the end point, the post treatment is terminated.

In a further aspect, the detected output signal is differentially analyzed, and an analyzed value is monitored. When the point in time at which the analyzed value reaches zero is found, the fact that the point in time is an end point is indicated.

Illustratively, the gas comprising elements, which react chemically with the remaining reactive chemical species, are a silicon hydride gas, or a mixture of silicon hydride gas and another gas, for example, hydrogen gas, nitrogen gas or ammonia gas.

In the in-situ cleaning process, preferably a nitrogen trifluoride gas is introduced, and a plasma is generated in the nitrogen trifluoride gas.

In the thin film formation process, an amorphous silicon thin film is formed.

According to the present invention, it is possible to detect accurately the end point of the post treatment after the in-situ cleaning in the reactor.

The above and further objects, aspects and novel features of the invention will more fully appear from the following detailed description of a preferred embodiment when read in connection with the accompanying drawings.

DETAILED DESCRIPTION OF THE PRESENTLY PREFERRED EMBODIMENTS

Figure 1:
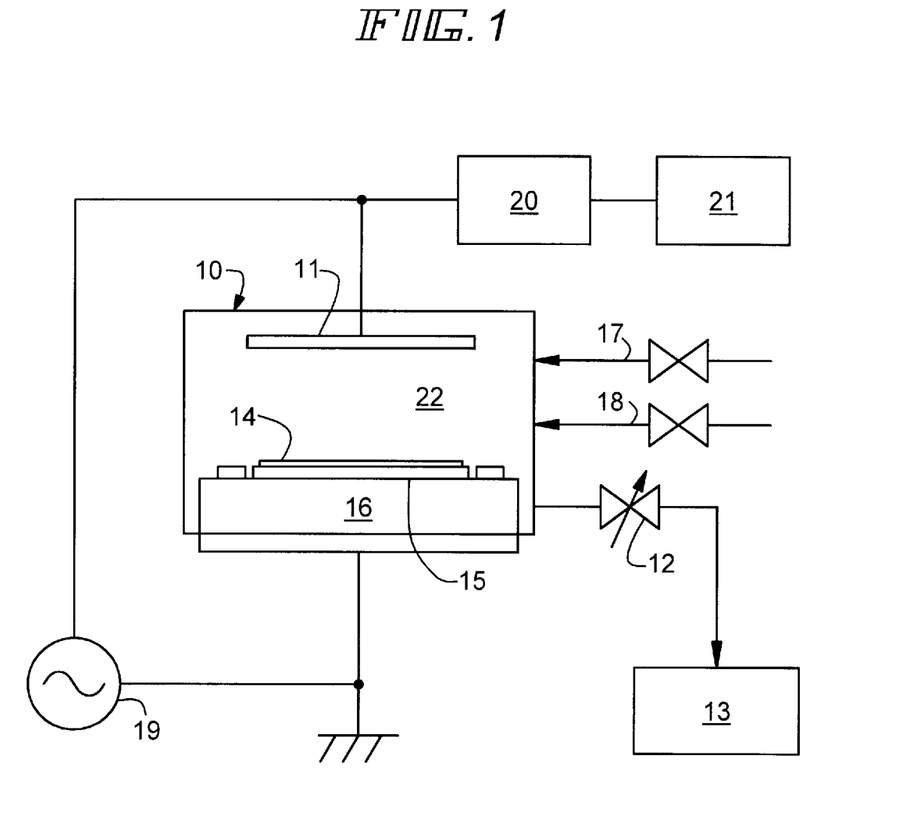
FIG. 1 is a schematic view of an embodiment of the present invention.

FIG. 1 is a schematic view of a PECVD apparatus having a post treatment end point detecting apparatus installed therein in accordance with a preferred embodiment of the present invention. The PECVD apparatus includes a reactor 10 which is a vacuum enclosure whose pressure can be reduced. An RF electrode 11 in a disc shape is disposed in the inner upper portion of the reactor 10. The reactor 10 is evacuated through a pressure regulating valve 12 by a vacuum pump 13. A substrate 14 for forming a thin film, for example a glass substrate, is placed on a tray 15 for transporting the substrate. The substrate 14 is transported in and out of the reactor 10 when the substrate transport tray 15 goes in and out of the reactor 10. When the substrate 14 is to be subjected to PECVD processing, the substrate transport tray 15 is set in a holder 16 mounted in the bottom of the reactor 10.

A gas supply pipe 17 for introducing a gas for forming a thin film and a gas supply pipe 18 for introducing a gas for in-situ cleaning processing are connected to the side wall of the reactor 10. The pressures of the gases introduced thereby are set by regulating the pressure regulating valve 12.

A plasma 22 is generated between the RF electrode 11 and the substrate 14 by applying RF electric power to the RF electrode 11 from an RF power supply 19. To detect discharge characteristic values, such as the self-bias voltage, the electrode voltage or the discharge impedance, at the RF electrode 11 during discharge, a detector or detecting circuit 20, having a meter transformer and a filtering circuit, is connected to the RF electrode. A monitor/determining circuit 21 for detecting the end point of the post treatment by analyzing the output signal of the detector 20 is connected to the detector.

Figure 2A:
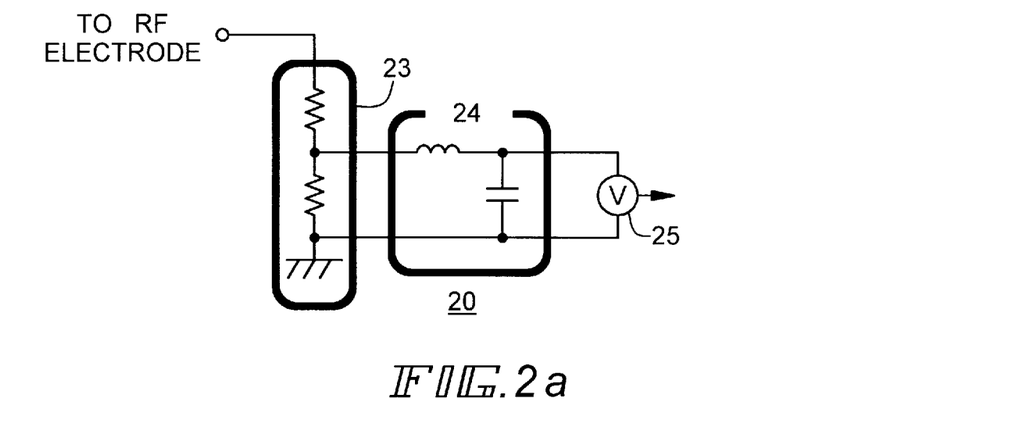
FIG. 2A is a diagram of the detector circuit for detecting a self-bias voltage.
Figure 2B:
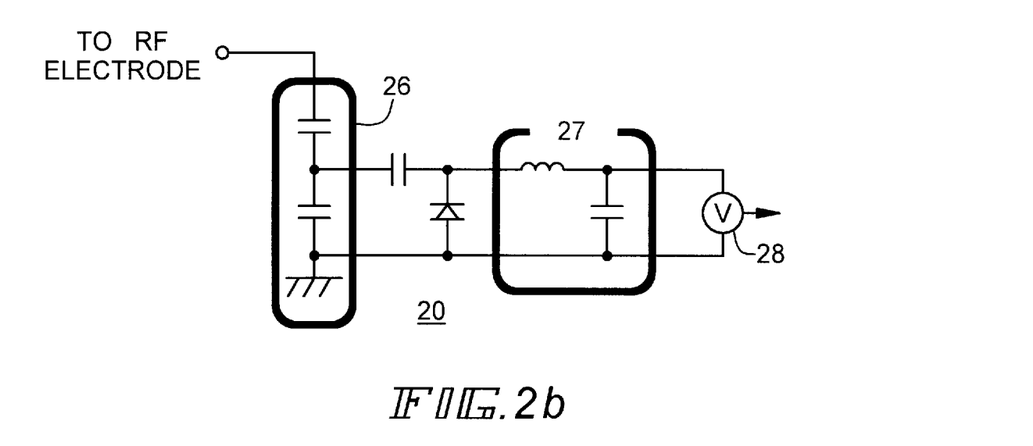
FIG. 2B is a diagram of the detector circuit for detecting an electrode voltage.
Figure 2C:
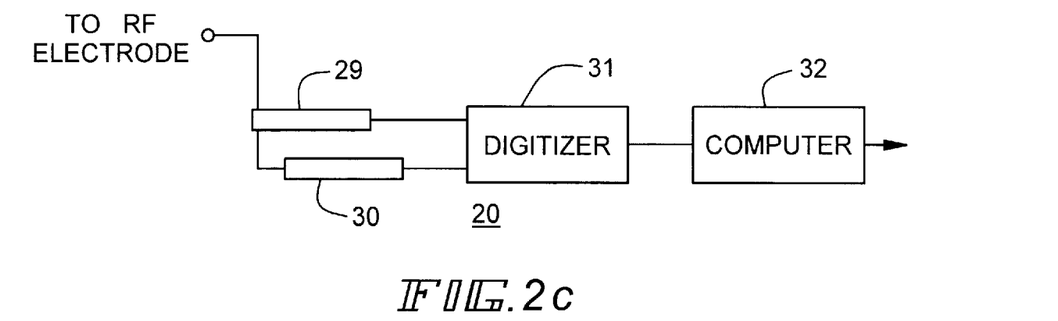
FIG. 2C is a diagram of the detector circuit for detecting a discharge impedance.

FIGS. 2A, 2B and 2C are diagrams of the preferred detector or detecting circuit 20. FIG. 2A shows how a self-bias voltage is detected as a characteristic value. FIG. 2B shows how an electrode voltage is detected. FIG. 2C shows how a discharge impedance is detected. The detector 20, shown in FIG. 2A for detecting the self-bias voltage, preferably comprises a resistance dividing circuit 23, a smoothing circuit 24, and a voltage detector 25. A display for displaying the voltage is optional. The detector 20, shown in FIG. 2B for detecting the electrode voltage comprises a capacitor dividing circuit 26, a smoothing circuit 27, and a voltage detector 28. The detector 20, shown in FIG. 2C for detecting the discharge impedance, preferably comprises an electric current probe 29, a voltage probe 30, a digitizer 31, and a computer-controlled impedance computation device 32.

The monitor/determining circuit 21 monitors changes in the output signal from the voltage detectors 25 and 28, and the impedance computation device 32 of the detector 20 shown in FIGS. 2A, 2B and 2C through differential analysis. Further, the monitor/determining circuit 21, as shown in FIG. 5B, finds the point in time at which the differentially analyzed value, that is the inclination of the output signal of the detector 20, becomes zero. The monitor/determining circuit 21 indicates which point in time is the end point of the post treatment. Also, the monitor/determining circuit 21 may find the point in time at which the output signal of the detector 20 shifts to a constant value and may indicate that the point in time is the end point.

Figure 3:
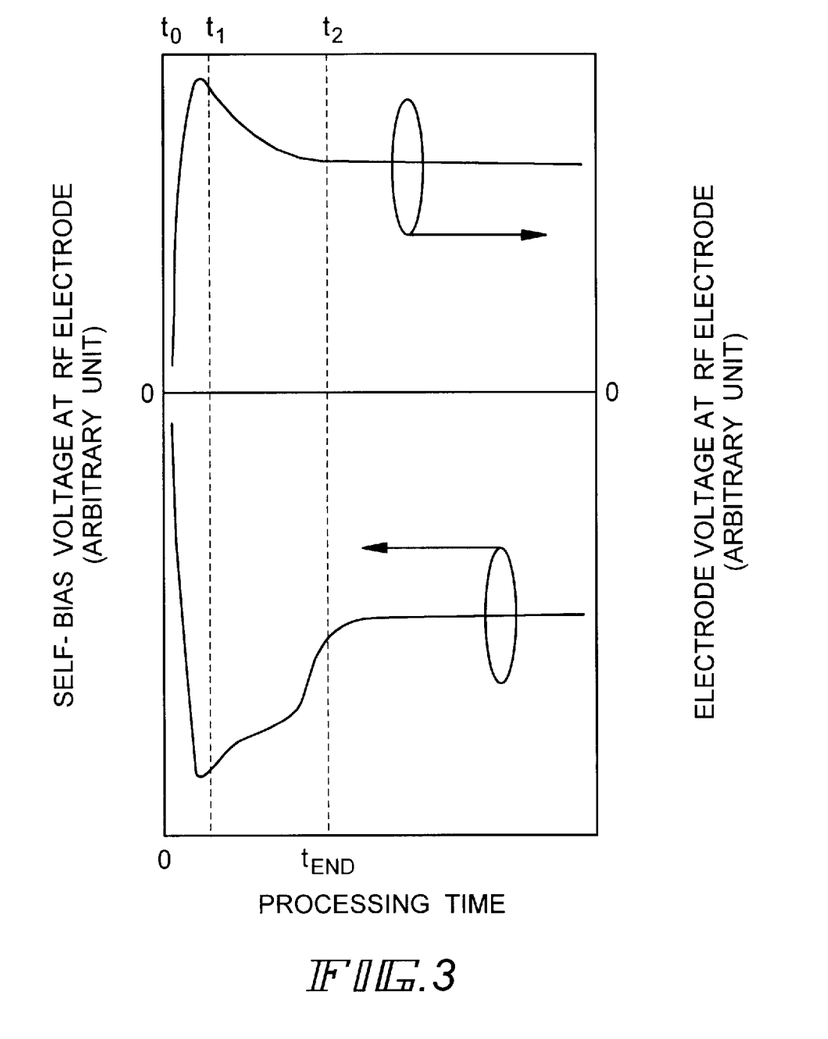
FIG. 3 shows changes in a self-bias voltage and an electrode voltage when monosilane hydrogen gas plasma processing is performed as a preferred example of a post treatment after an in-situ cleaning process using a nitrogen trifluoride gas.

FIG. 3 shows changes in the self-bias voltage and the electrode voltage during the post treatment. The post treatment is performed after the in-situ cleaning. In the in-situ cleaning operation, nitrogen trifluoride gas is introduced through the gas supply pipe 18 to the reactor 10 after an amorphous silicon thin film is formed on the substrate 14 by PECVD reaction using a mixture gas of monosilane and hydrogen. As the nitrogen trifluoride gas is introduced, a plasma is generated to perform in-situ cleaning of the interior of the reactor 10. After the in-situ cleaning, the post treatment was performed in such a way that a mixture gas of monosilane and hydrogen was introduced into the reactor 10, and a plasma was generated in the mixture gas.

The self-bias voltage and the electrode voltage both change sharply at time period to $t_0$ $t_1$ in the initial post treatment. Then, in time period $t_0$ to $t_2$, the voltages change slightly, and become nearly constant at time $t_2$ or later. The time $t_2$ is assumed to be the end point $t_{END}$ of the post treatment.

The discharge impedance, similar to that of the self-bias voltage and the electrode voltage, changes sharply, then changes slightly, and then becomes nearly constant. The end point of the post treatment is detected on the basis of the time at which the change of the discharge impedance becomes nearly constant.

Figure 4:
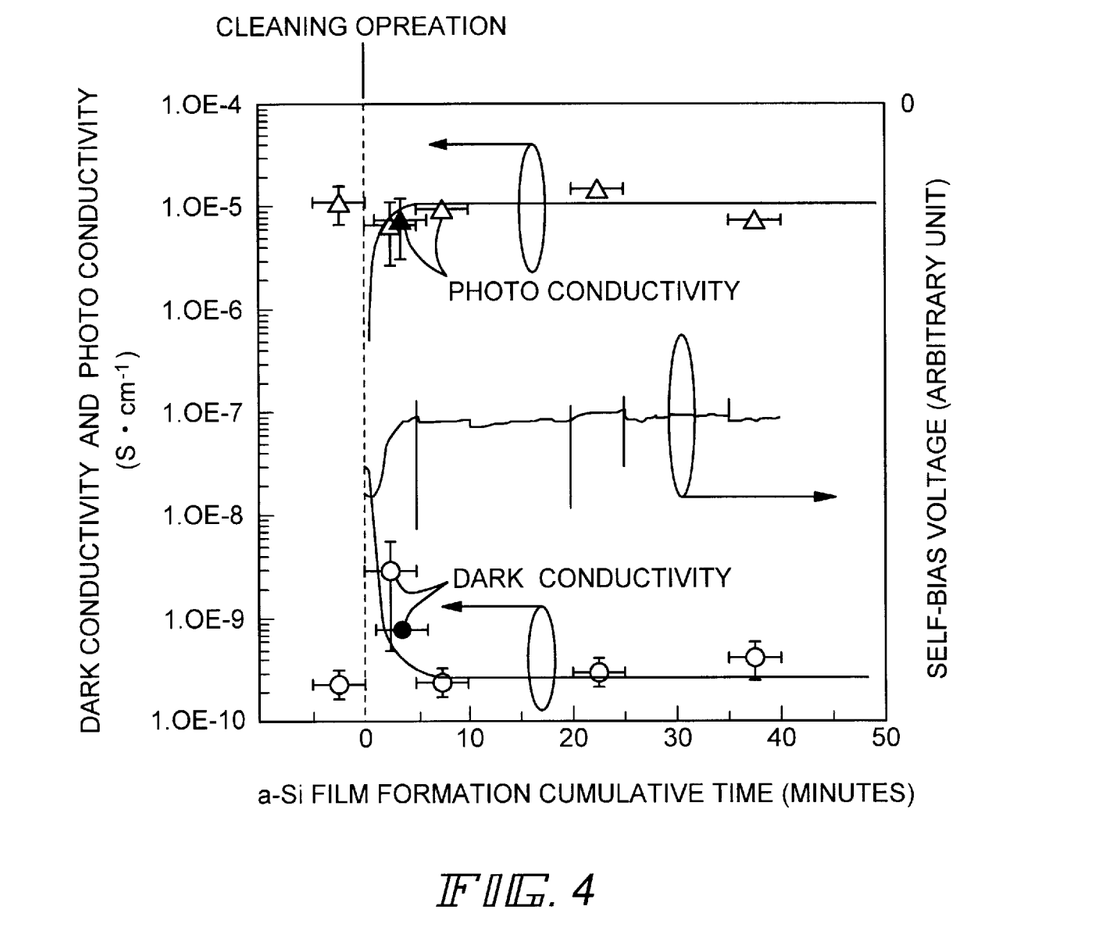
FIG. 4 shows changes in the dark conductivity, the photo conductivity, and the self-bias voltage with respect to the a-Si film formation cumulative time after the in-situ cleaning process.

FIG. 4 shows the electrical conductivity characteristic of an amorphous silicon (a-Si) thin film formed after the in-situ cleaning process using nitrogen trifluoride gas plasma. FIG. 4 shows that the dark and photo conductivities are approaching those before the cleaning operation as the number of times of the film formation of a-Si increases, that is, the a-Si film formation cumulative time. The in-situ cleaning operation was performed in such a way that a nitrogen trifluoride gas was introduced to the reactor 10 at a flow rate of 7.5 sccm, the pressure of the nitrogen trifluoride gas inside the reactor 10 was set at 100 Pa, and a RF power of 100 W was applied to the RF electrode 11. The distance between the RF electrode and the holder 16 is 20 mm, and a plasma was generated in the nitrogen trifluoride gas in a space between the RF electrode and the holder 16. At the time when the color of the inner wall of the reactor 10 changed while the plasma was being generated, the in-situ cleaning operation was terminated.

After the cleaning operation was completed, a silane gas was introduced to the reactor 10 at a flow rate of 7.5 sccm, and a hydrogen gas was introduced to the reactor 10 at a flow rate of 30 sccm. The pressure of the mixture gas of silane and hydrogen inside the reactor 10 was set at 200 Pa. After the temperature of the substrate 14 was set at 250° C., a RF power of 4.5 W was applied to the RF electrode 11 to generate a plasma in the mixture gas, and thus an amorphous silicon thin film was formed on the substrate 14. The film formation time of the amorphous silicon thin film per one substrate was five minutes, and its film thickness was about 500 angstroms.

In FIG. 4, the horizontal axis indicates the a-Si film formation cumulative time, and the vertical axis indicates dark conductivity and photo conductivity. The ○ and Δ marks indicate the dark conductivity and the photo conductivity of the amorphous silicon thin film formed after the in-situ cleaning, respectively. The ● and ▲ marks indicate the dark conductivity and the photo conductivity of the amorphous silicon thin film formed after the post treatment was performed for about 60 second inside the reactor immediately after the in-situ cleaning operation. The error or tolerance lines in the horizontal direction indicate the time range required to form the respective thin films, and the error or tolerance line in the vertical direction indicates the standard deviation of each measured conductivity value. In the above experiments indicated by the ○ and Δ marks, changes in the self-bias voltage of the RF electrode, detected when each thin film was manufactured, are shown at the same time. The slight shift of the self-bias value is caused (for every film formation) by the RF power set error which means that the applied RF power is deviating from a set value during film formation.

The electrical conductivity (photo and dark conductivities) of the thin film formed at an a-Si film formation cumulative time of 0 to 5 minutes is associated with a change in the sharp self-bias voltage during this time. The electrical conductivity prior to the in-situ cleaning operation is not reproduced during this period. In the a-Si film formation cumulative time of 5 minutes or longer, the electrical conductivity of the thin film formed in a period in which the self-bias voltage becomes nearly constant reproduces the value achieved prior to the in-situ cleaning operation. It may be said that a dielectric of a silicon-containing compound was formed on the electrodes and the inner wall by the PECVD reaction of a mixture gas of silan and hydrogen for the formation of the amorphous silicon thin film. The formation of the dielectric of a silicon-containing compound eliminates the fluorine radicals remaining on the electrodes and the inner wall.

A post treatment was performed for about 60 seconds at measurement points ● and ▲. Since the post treatment terminates before the self-bias voltage becomes constant, the electrical conductivity before the cleaning operation is not completely reproduced. However, in comparison with the electrical conductivity of the thin film formed in 0 to 5 minutes after the cleaning operation, the electrical conductivity of the thin film formed in 0 to 5 minutes after the post treatment for about 60 seconds is quite close to the value before the in-situ cleaning operation.

FIG. 4 shows that the method of detecting the end point of the post treatment using the discharge characteristic values (the self-bias voltage, the electrode voltage, and the discharge impedance), in accordance with the present invention, is appropriate as an end point detection method.

Figure 5A:
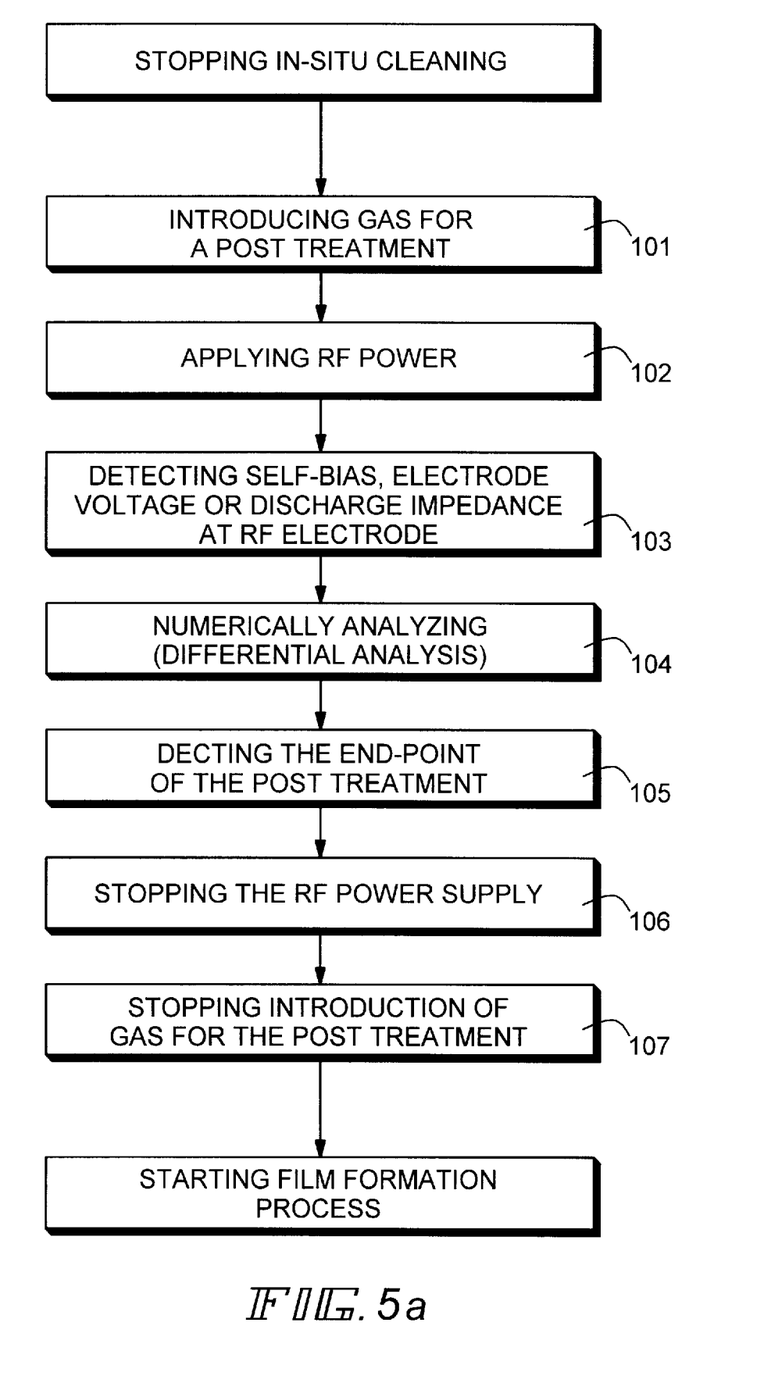
FIG. 5A is a flowchart of a post treatment showing how the present invention may be used.
Figure 5B:
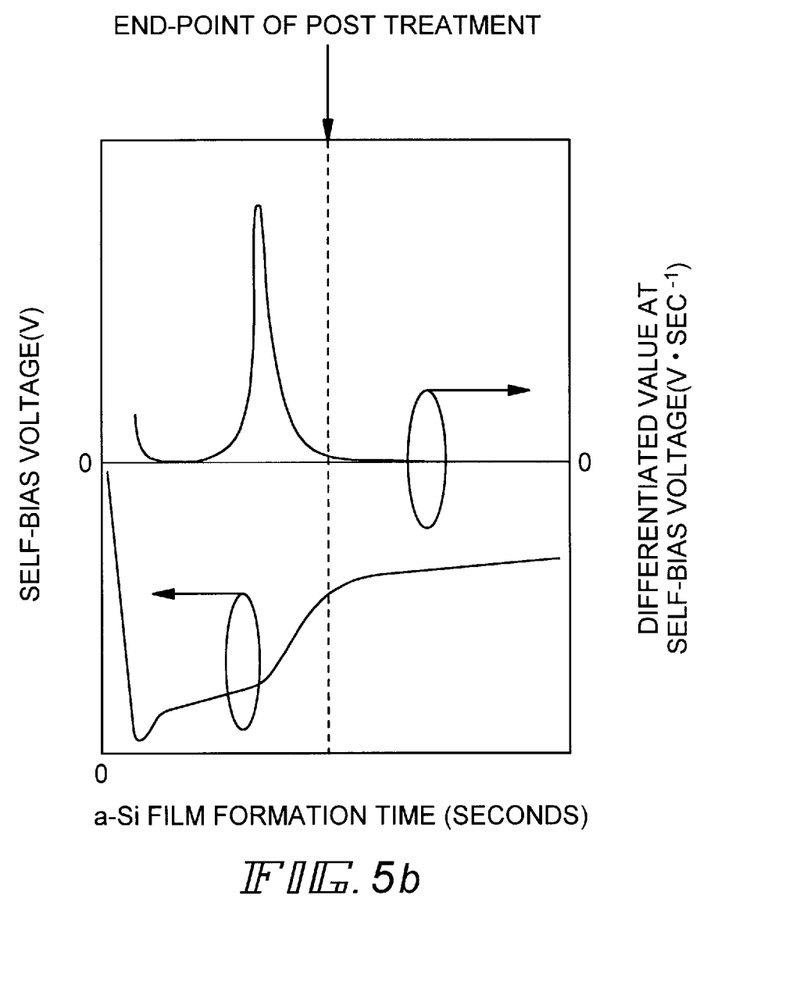
FIG. 5B is a representative graph of the differential analysis of changes in the self-bias voltage with respect to the post treatment time.

FIG. 5A is flowchart illustrating an example of post treatment control. Initially, as shown in box 101 a gas for a post treatment is introduced into the reactor in which the in-situ cleaning operation has been completed. Next, at box 102, RF power is applied to start the post treatment. At this time, the discharge characteristic values of the RF electrode are detected by the detector 20, as shown by box 103. The differential analysis shown as box 104 in FIG. 5B is performed on the detected value by the monitor/determining circuit 21. The point in time at which the change in the differentially analyzed value comes close to being constant is then found, and thus the end point of the post treatment is detected at box 105. When the end point is detected, the RF power supply is stopped at box 106, and the introduction of the gas for the post treatment is stopped (box 107). Thus the post treatment is terminated.

By utilizing the apparatus and method of the embodiment shown in FIGS. 1 to 5, the end point of the post treatment is accurately detected using the discharge characteristic values (the self-bias voltage, and electrode voltage, and the discharge impedance) of the RF electrode.

The present invention can also be applied to the following cases:

(1) When a trayless PECVD apparatus having no substrate transport tray 15 is used;

(2) When an electric discharge is performed using a gas other than a mixture of monosilane and hydrogen gases as a post treatment. For example, the present invention may be applied to detect the end point of the PECVD process using a mixture of monosilane and argon gases;

(3) When reactive chemical species are produced without a discharge plasma, and the silicon-containing compound deposited on the inner wall of the reactor 10 can be removed in the in-situ cleaning operation. The end point of the subsequent post treatment can be detected even if the in-situ cleaning operation is performed in a plasmaless state, or (4) When at least one characteristic value of the self-bias voltage, the electrode voltage, and the discharge impedance is detected. However, two or three of the characteristic values may be detected at the same time, and a determination made by considering all the factors.

According to the present invention, since it is possible to remove the correct amount of reactive chemical species remaining after the in-situ cleaning, the thin film characteristics of the thin film, which is repeatedly formed, can be reproduced, and electric devices, which are produced in large scale, can be maintained at a desired quality. Further, according to the present invention, since the period of the post treatment is accurately recognized, the uptime ratio of the apparatus can be improved, and the throughput of the apparatus can be increased.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An end point detecting apparatus for use when cleaning plasma enhanced chemical vapor deposition (PECVD) equipment, comprising:

a detecting circuit for detecting discharge characteristic values at an RF electrode and producing an output signal; and a monitor/determining circuit for determining an end point while monitoring the output signal from said detecting circuit during a post treatment after cleaning.

2. An end point detecting apparatus according to claim 1, wherein said detecting circuit comprises a resistance divider circuit, a smoothing circuit, and a voltage detector.

3. An end point detecting apparatus according to claim 1, wherein said detecting circuit includes a capacitor dividing circuit, a smoothing circuit, and a voltage detector.

4. An end point detecting apparatus according to claim 1, wherein said detecting circuit includes an impedance computation device.

5. An endpoint detecting apparatus according to claim 4, wherein said detecting circuit further includes an electric current probe, a voltage probe, and a digitizer.

6. An end point detecting apparatus according to claim 1, wherein said monitor/determining circuit differentially analyzes the output signal from said detecting circuit and indicates when a point in time at which one of the discharge characteristic values reaches zero is found, that that point in time is an end point.

7. An end point detecting apparatus according to claim 1, wherein said monitor/detecting circuit determines a point in time at which the output signal from said detecting circuit shifts to a constant value and indicates that said point is an end point.

8. An end point detecting apparatus according to claim 1, wherein said end point detecting apparatus is incorporated in a PECVD apparatus comprising a reactor capable of reducing pressure, RF electrodes disposed inside the reactor, a power supply for applying RF electric power to the RF electrodes, a first gas supply consisting essentially of nitrogen trifluoride for introducing gas for forming a thin film into the reactor, and a second gas supply consisting essentially of a mixture of monosilane and hydrogen for introducing gas for in-situ cleaning an interior of the reactor.

9. An end point detecting apparatus according to claim 1, wherein said discharge characteristic value is a constant value based on changes in the self-bias voltage, RF electrode voltage, and electric-discharge impedance of plasma, as measured at an RF electrode mounted inside a reactor of a PECVD apparatus during post treatment.

* * * * *